(12) United States Patent
Chen et al.

(10) Patent No.: US 10,249,629 B1
(45) Date of Patent: Apr. 2, 2019

(54) METHOD FOR FORMING BURIED WORD LINES

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Li-Chiang Chen, Tainan (TW); Fu-Che Lee, Taichung (TW); Ming-Feng Kuo, Tainan (TW); Chieh-Te Chen, Kaohsiung (TW); Hsien-Shih Chu, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/876,220

(22) Filed: Jan. 22, 2018

(51) Int. Cl.
| | |
|---|---|
| *H01L 27/108* | (2006.01) |
| *H01L 21/311* | (2006.01) |
| *H01L 29/06* | (2006.01) |
| *H01L 29/423* | (2006.01) |
| *H01L 21/306* | (2006.01) |
| *H01L 21/308* | (2006.01) |
| *H01L 21/027* | (2006.01) |
| *H01L 21/768* | (2006.01) |
| *H01L 21/3105* | (2006.01) |
| *H01L 21/3213* | (2006.01) |

(52) U.S. Cl.
CPC .... *H01L 27/10891* (2013.01); *H01L 21/0273* (2013.01); *H01L 21/3081* (2013.01); *H01L 21/3086* (2013.01); *H01L 21/30604* (2013.01); *H01L 21/31058* (2013.01); *H01L 21/31111* (2013.01); *H01L 21/31144* (2013.01); *H01L 21/32133* (2013.01); *H01L 21/76877* (2013.01); *H01L 27/10876* (2013.01); *H01L 29/0649* (2013.01); *H01L 29/4236* (2013.01)

(58) Field of Classification Search
CPC ......... H01L 29/42356; H01L 27/10891; H01L 21/76877; H01L 29/4236; H01L 21/3081; H01L 21/31058
See application file for complete search history.

(56) References Cited

U.S. PATENT DOCUMENTS

| | | | |
|---|---|---|---|
| 5,429,988 A | 7/1995 | Huang | |
| 6,239,008 B1 | 5/2001 | Yu | |
| 8,338,250 B2 * | 12/2012 | Ma | H01L 21/28273 438/257 |
| 2011/0027988 A1 * | 2/2011 | Hwang | H01L 21/743 438/656 |

(Continued)

*Primary Examiner* — Willam F Kraig
*Assistant Examiner* — Khatib A Rahman
(74) *Attorney, Agent, or Firm* — Winston Hsu

(57) ABSTRACT

The present invention provides a method for forming buried word lines. Firstly, a substrate is provided, having a plurality of shallow trench isolations disposed therein, next, a plurality of first patterned material layers are formed on the substrate, a plurality of first recesses are disposed between every two adjacent first patterned material layers, a second patterned material layer is formed in the first recesses, and using the first patterned material layers and the second patterned material layer as the protect layers, and a first etching process is then performed, to form a plurality of second recesses in the substrate.

14 Claims, 6 Drawing Sheets

(56) References Cited

U.S. PATENT DOCUMENTS

2015/0340459 A1* 11/2015 Lee .................. H01L 27/10891
                                                                   438/585
2016/0181107 A1* 6/2016 Shin .................. H01L 27/11534
                                                                   438/592

\* cited by examiner

METHOD FOR FORMING BURIED WORD LINES

BACKGROUND OF THE INVENTION

1. Field of the Invention

The present invention relates to the field of semiconductor manufacturing, and more particularly to a method for fabricating buried word lines.

2. Description of the Prior Art

Dynamic random access memory (DRAM) is a kind of volatile memory, which is constituted by a plurality of memory cells. Each memory cell is mainly constituted by one transistor and one capacitor controlled by a transistor, and each memory cell are electrically connected by the word line (WL) and bit line (BL).

In order to improve the operation speed of the dynamic random access memory, and to meet consumer demand for miniaturization of electronic devices, the channel length of the transistor of the dynamic random access memory needs to be shorten. However, others issues may be happened, such as short channel effects, the on current loss and other problems.

Accordingly, in order to overcome the above problems, in recent years, the vertical transistor structure replaces the horizontal transistor structure, for example, the vertical transistor structure is formed in a deep trench in the substrate. In this way, the operating speed and the volume can be improved, and the short channel effect and other issues can also be prevented. However, the general vertical transistor used in structural design still needs to be improved, it is one of the goals researched in this field.

SUMMARY OF THE INVENTION

The present invention provides a method for forming buried word lines. Firstly, a substrate is provided, having a plurality of shallow trench isolations disposed therein, next, a plurality of first patterned material layers are formed on the substrate, a plurality of first recesses are disposed between every two adjacent first patterned material layers, a second patterned material layer is formed in the first recesses, and using the first patterned material layers and the second patterned material layer as the protect layers, and a first etching process is then performed, to form a plurality of second recesses in the substrate.

The present invention provides a novel method for fabricating buried word lines in a DRAM. The feature is that a patterned organic dielectric layer and another patterned organic dielectric layer subsequently filled are used as the masks, to perform an etching step and to forma plurality of recesses in the substrate. Since the organic dielectric material is cheaper and the gap fill ability is better, so the effect of improving the manufacturing yield and reducing the cost can be achieved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
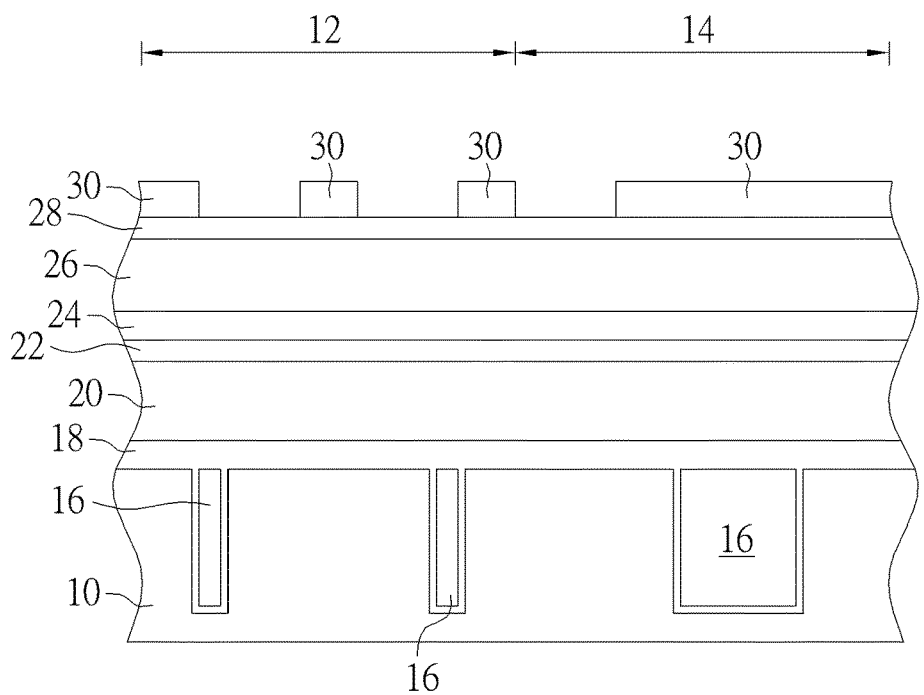
FIGS. 1-11 are cross-sectional views for forming the buried word lines of the first preferred embodiment of the present invention.

FIGS. 1-11 are cross-sectional views for forming the buried word lines of the first preferred embodiment of the present invention. As shown in FIG. 1, a substrate 10 is provided. A cell region 12 and a logic region 14 are defined on the substrate 10. In the following steps, the buried word lines of the present invention that will be formed are mainly located in the cell region 12.

The substrate 10 includes a plurality of shallow trench isolation (STI) 16, and the substrate 10 includes a multi-layers structure. The multi-layers structure may include an oxide layer 18, an amorphous carbon (APF) layer 20, and a nitride layer 22, but not limited thereto. In this embodiment, the oxide layer 18 covers the substrate 10 directly to protect the substrate 10, and the oxide layer 18 can be subsequently removed by an ashing process, so that the oxide layer 18 has less influence to the device. In addition, in the present invention, the oxide layer 18 has a thickness of about 400-600 angstroms, the amorphous carbon layer 20 has a thickness of about 1500-2500 angstroms, and the nitride layer 22 has a thickness of about 150-250 angstroms, but not limited thereto.

An oxide layer 24 is additionally formed on the multi-layers structure (e.g., the oxide layer 18, the amorphous carbon layer 20 and the nitride layer 22), the oxide layer 24 has a thickness of about 300-500 angstroms, such as 400 angstroms. Next, a photoresist layer is formed on the oxide layer 24. The photoresist layer may comprise a single layer or a multi-layers structure. Taking this embodiment as an example, the photoresist layer is a multi-layers structure, including a plurality of photoresist layers, such as an organic dielectric layer (ODL) 26, a silicon-containing hard-mask bottom anti-reflection coating (SHB) 28, and a patterned photoresist layer 30. The thickness of the organic dielectric layer 26 is about 1500-2500 angstroms, but is not limited thereto.

Figure 2:
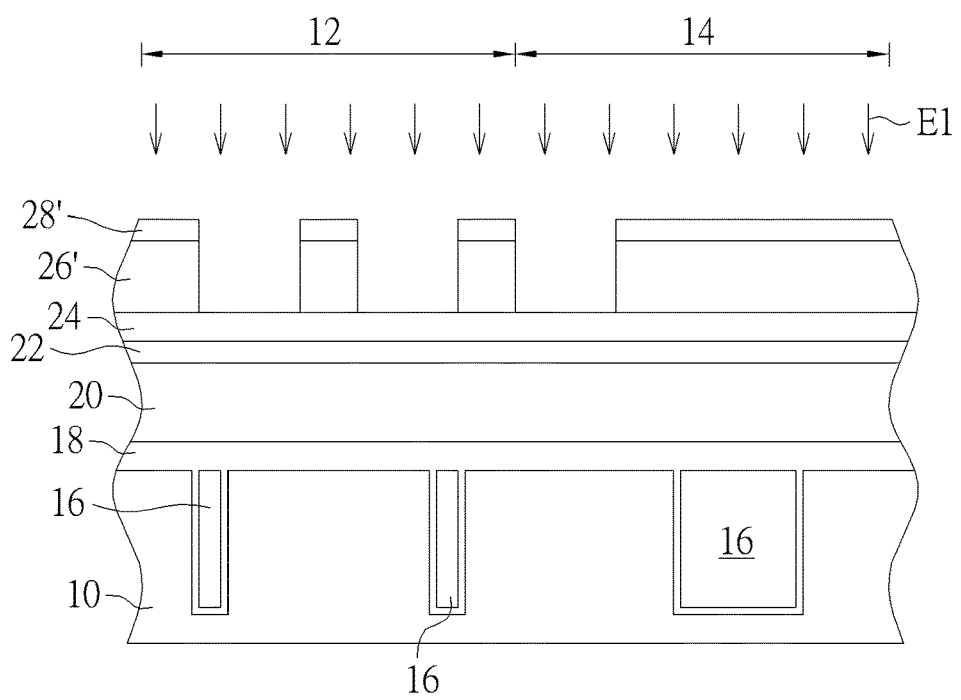
Figure 3:
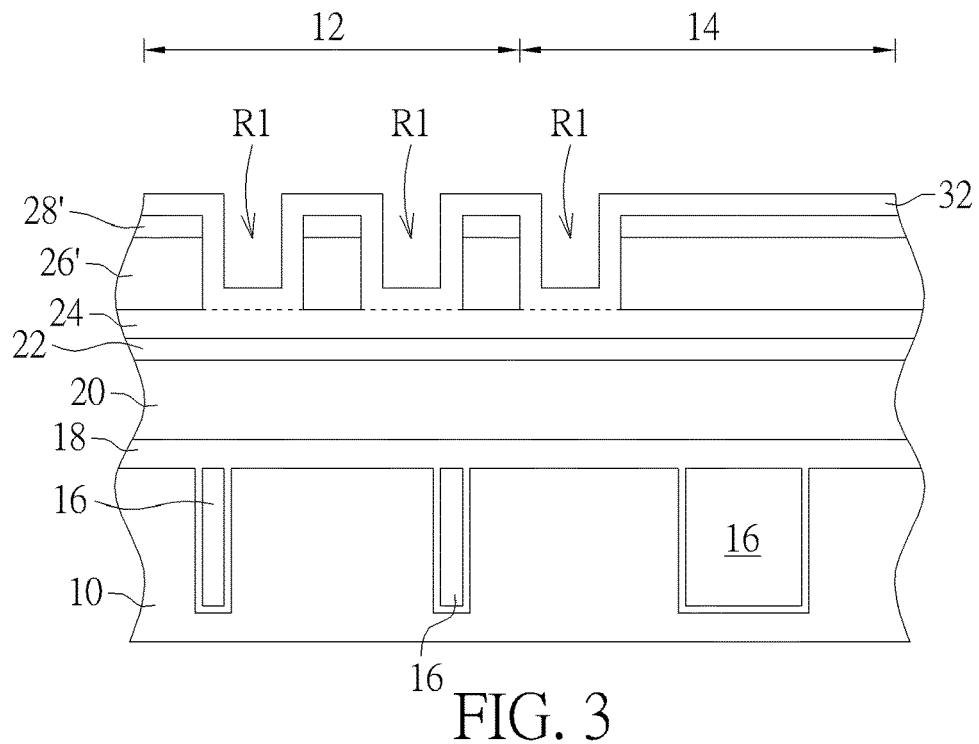

Next, as shown in FIGS. 2-3, an etching step E1 is performed. Using the patterned photoresist layer 30 as a mask, to remove portions of the organic dielectric layer 26 and portion of the SHB 28, and to form a patterned organic dielectric layer 26' and a patterned SHB 28'. Besides, the exposed part of the oxide layer 24, and the patterned photoresist layer 30 is also removed. Then, as shown in FIG. 3, an oxide layer 32 is formed to cover the patterned organic dielectric layer 26', the patterned SHB 28' and the oxide layer 24. In other words, the bottom and two sidewalls of the patterned organic dielectric layer 26' will contact the oxide layer 24 and the oxide layer 32 respectively. Since the oxide layer 32 has a "battlements profile" as seen from the cross-sectional view, the recessed portion of the oxide layer 32 is defined as a plurality of first recesses R1. In this embodiment, the oxide layer 32 has a thickness of about 200-300 angstroms, for example, 240 angstroms. In addition, the oxide layer 24 and the oxide layer 32 preferably have the same material or the same etching rate, and therefore they can be removed simultaneously in the subsequent etching step.

Figure 4:
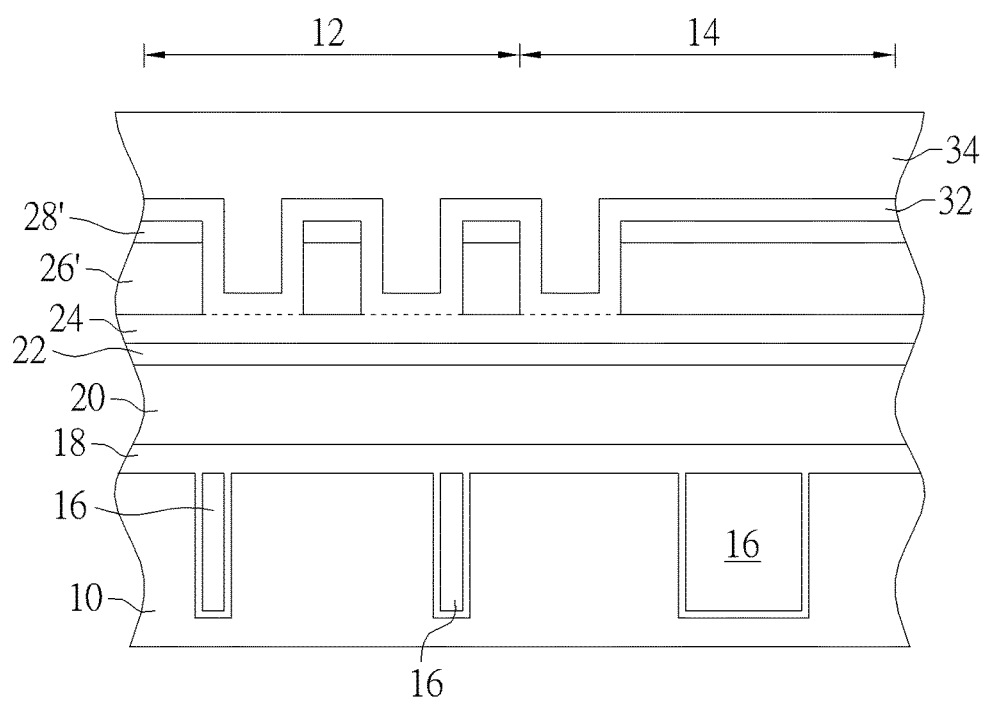
Figure 5:
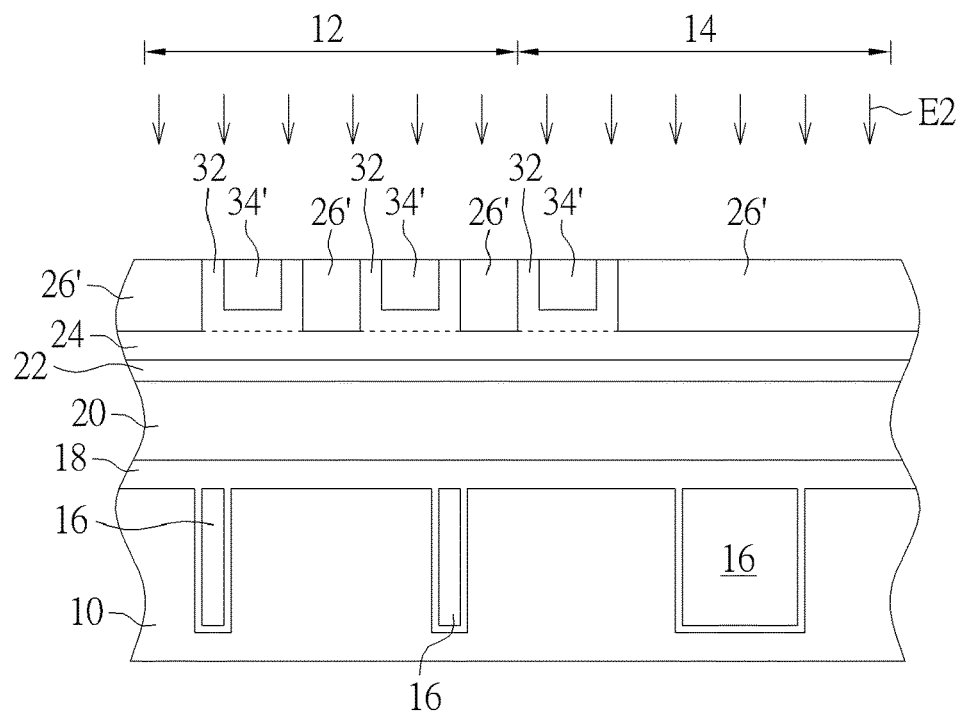

As shown in FIGS. 4-5, another organic dielectric layer 34 is formed again to fill each first recess R1. The material of the organic dielectric layer 34 is preferably same as that of the organic dielectric layer 26. Then, as shown in FIG. 5, a planarization etching step E2 is performed to partially remove the organic dielectric layer 34. By the etching step E2 in this step or by another different etching steps, the top surface of the patterned organic dielectric layer 26' is exposed. At the same time, the remaining organic dielectric layer 34 is defined as the patterned organic dielectric layer 34'. In other words, the top surface of the patterned organic dielectric layer 26', the top surface of the patterned organic dielectric layer 34', and part of the oxide layer 32 are exposed. In addition, a portion of the oxide layer 32 is disposed between the patterned organic dielectric layer 26 'and the patterned organic dielectric layer 34'.

Figure 6:
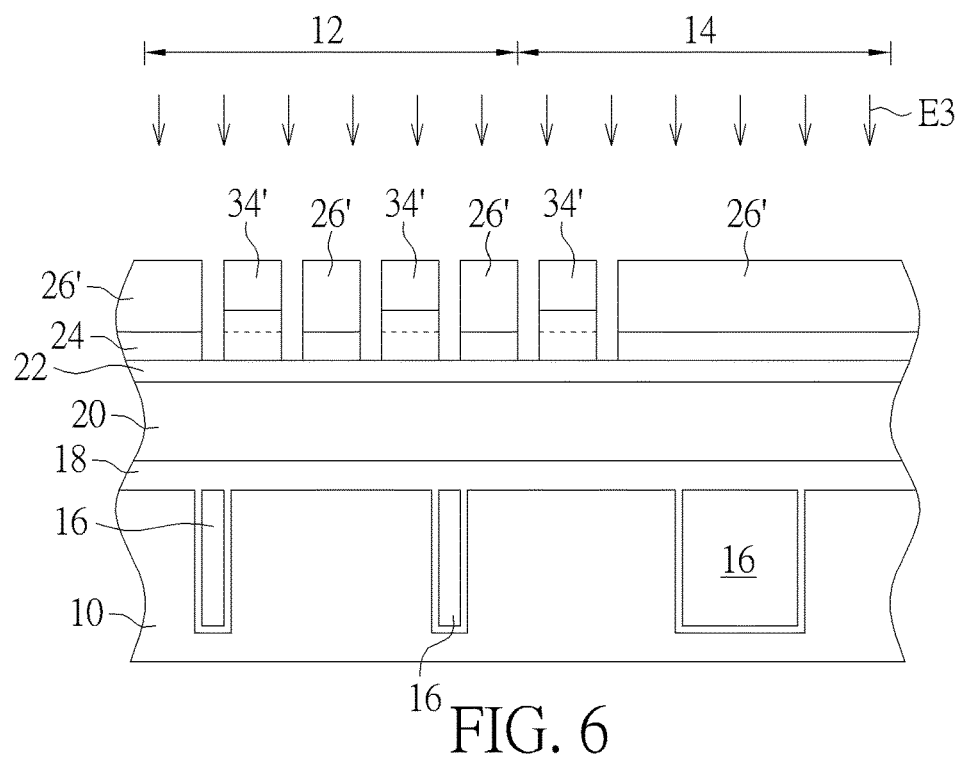
Figure 7:
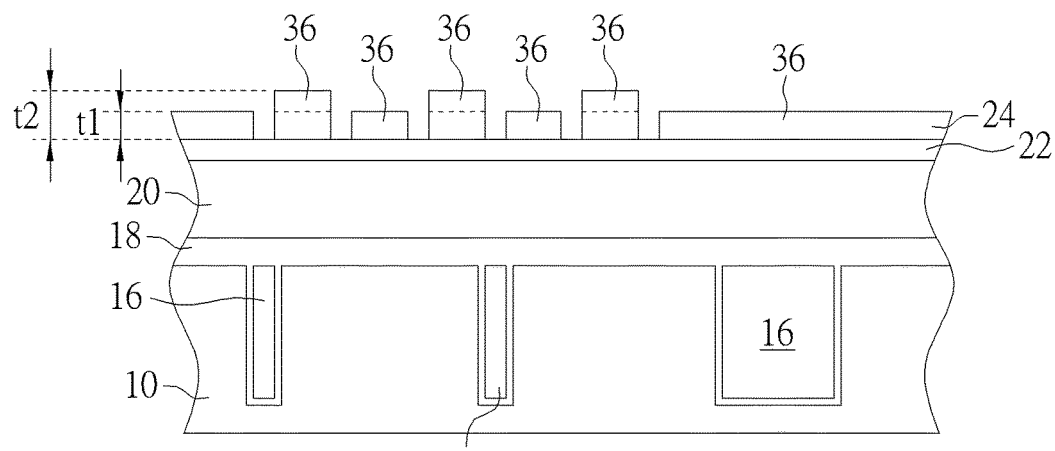

Next, as shown in FIGS. 6-7, the patterned organic dielectric layer 26' and the patterned organic dielectric layer 34' are used as the masks, and an etching step E3 is performed, to remove parts of the oxide layer 32 and parts of the oxide layer 24. Then, as shown in FIG. 7, the patterned organic dielectric layer 26' and the patterned organic dielectric layer 34' are removed by another etching step E4. It should be noticed that the remaining oxide layer 24 and oxide layer 32 are redefined as a plurality of oxide masks 36. Besides, since there is only the oxide layer 24 disposed between the original patterned organic dielectric layer 26' and the nitride layer 22, but there are two layers: the oxide layer 24 and oxide layer 32 are disposed between the patterned organic dielectric layer 34' and the nitride layer 22 (please also refer to FIG. 5), therefore, the remaining oxide masks 36 include at least two different thicknesses t1 and t2, and t2 is larger than t1.

Figure 8:
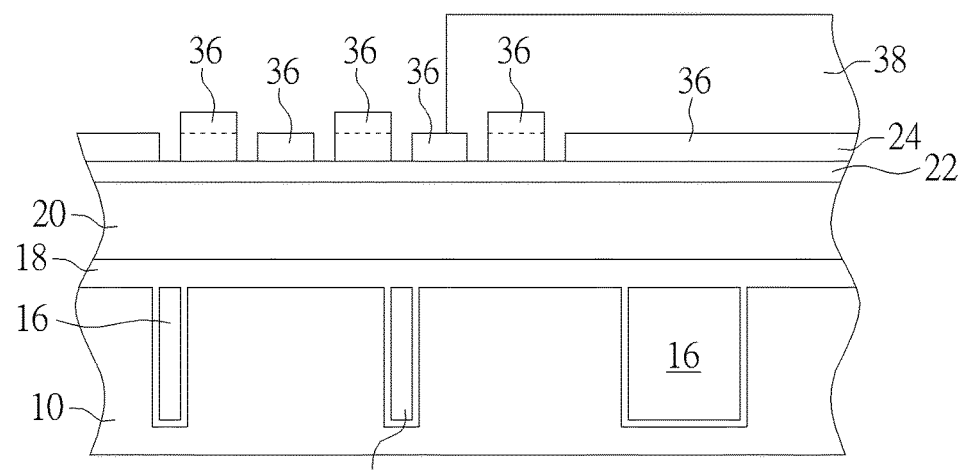
Figure 9:
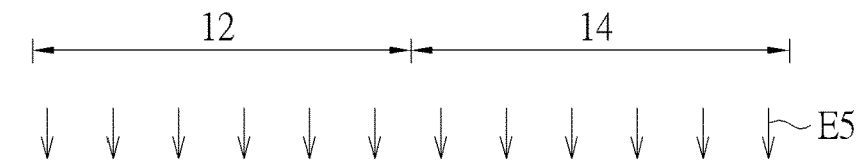
Figure 9:
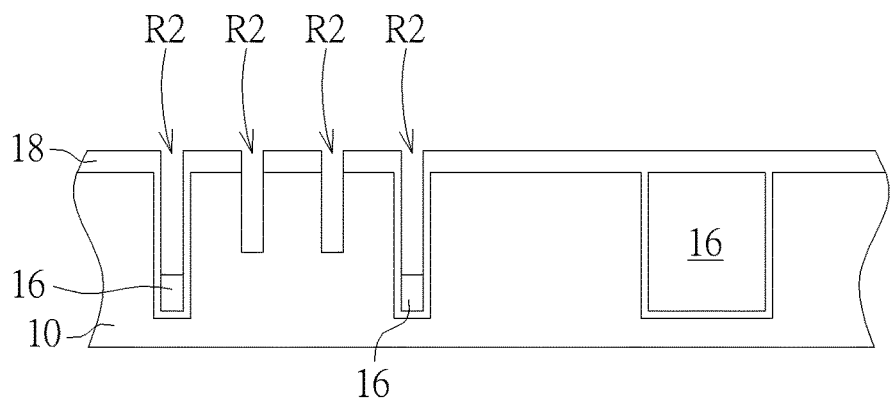

As shown in FIG. 8, a photoresist layer 38 is formed in the logic region 14 to protect other components in the logic region 14. Next, as shown in FIG. 9, an etching step E5 is performed by using the photoresist layer 38 and the oxide mask 36 as protective layers to sequentially etch the multi-layers structure (including the nitride layer 22, the amorphous carbon layer 20 and the oxide layer 18) and the substrate 10. A plurality of second recesses R2 are then formed in the substrate 10 and in the shallow trench isolation 16 within the cell region 12. Afterwards, the photoresist layer 38, the oxide mask 36, the nitride layer 22 and the amorphous carbon layer 20 may then be removed. However, in order to protect the substrate 10, the oxide layer 18 has not been completely removed in this step, and thus a portion of the oxide layer 18 still exists on the substrate 10.

Figure 10:
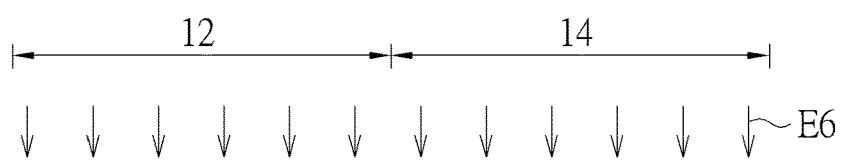
Figure 10:
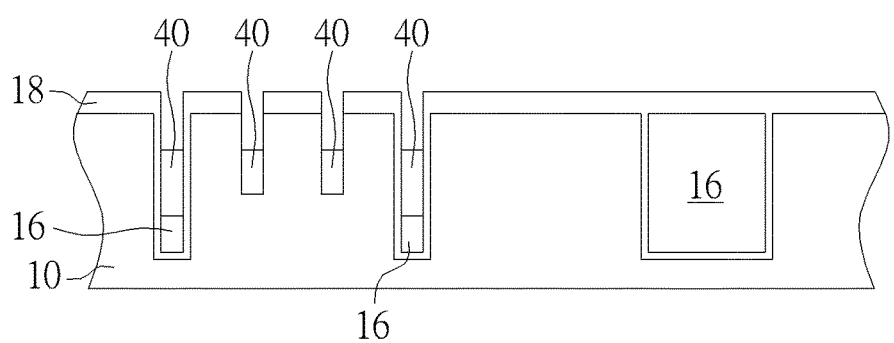
Figure 11:
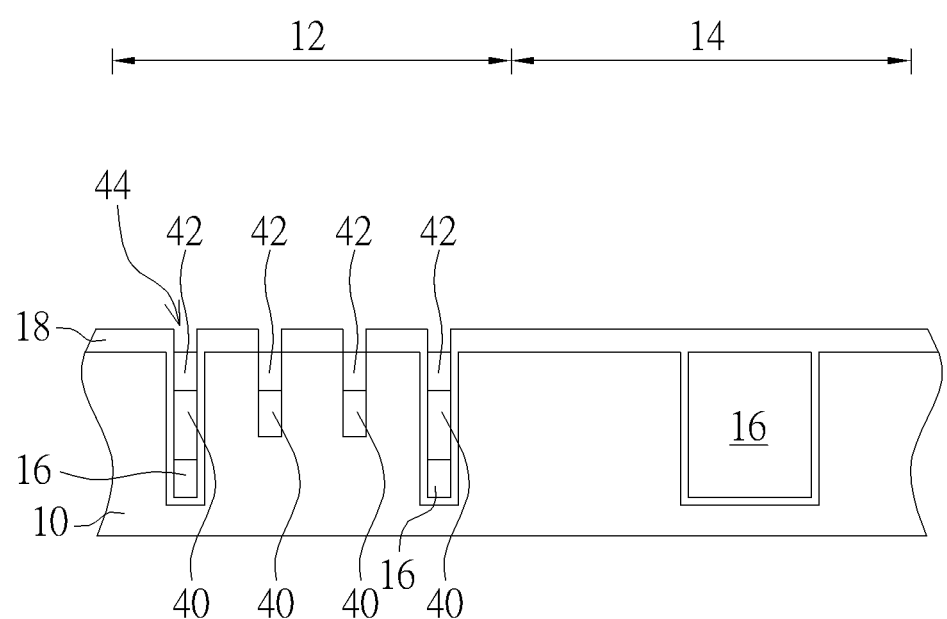

As shown in FIGS. 10-11, a conductive material layer (not shown) is formed on the oxide layer 18 to completely fill each second recess R2, and an etching back step E6 is then performed, to remove parts of the conductive material layer, and to form a plurality of conductive layer 40 in each second recess R2. Finally, as shown in FIG. 11, an insulating layer 42 is further filled on the remaining conductive layer 40. Until this step, the buried word line 44 provided by the present invention has been completed. In the following steps, other related semiconductor processes, such as DRAM fabrication, may be further performed. Those steps are not the main features of the present invention and will not be further described herein.

In summary, the present invention provides a novel method for fabricating buried word lines in a DRAM. The feature is that a patterned organic dielectric layer 26' and another patterned organic dielectric layer 34' subsequently filled are used as the masks, to perform an etching step and to form a plurality of recesses in the substrate. Since the organic dielectric material is cheaper and the gap fill ability is better, so the effect of improving the manufacturing yield and reducing the cost can be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming buried word lines; comprising:
providing a substrate, having a plurality of shallow trench isolations disposed therein;
forming a first oxide layer on the substrate;
forming a plurality of first patterned material layers on the first oxide layer, wherein a plurality of first recesses are disposed between every two adjacent first patterned material layers respectively;
forming a second patterned material layer in the first recesses;
forming a second oxide layer in the first recesses and covering at least two sidewalls of each of the first patterned material layers;
performing a first etching step to remove a portion of the first oxide layer and a portion of the second oxide layer, wherein the remaining first oxide layer and the remaining second oxide layer are defined as a plurality of oxide masks; and
using the first patterned material layers and the second patterned material layer as the protect layers, performing a second etching process, to form a plurality of second recesses in the substrate.

2. The method of claim 1, wherein a portion of the second oxide layer is disposed between the first patterned material layer and the second patterned material layer.

3. The method of claim 1, wherein each of the oxide masks is located between each of the first patterned material layers and the substrate, or disposed between the second patterned material layer and the substrate.

4. The method of claim 1, wherein the plurality of oxide masks comprise at least two different thicknesses.

5. The method of claim 1, wherein after the second etching step is performed, further comprising performing a third etching step, to remove the first patterned material layers and the second patterned material layer.

6. The method of claim 1, further comprising forming a conductive layer in the second recess.

7. The method of claim 6, further comprising performing an etching back step to remove parts of the conductive layer after the conductive layer is formed.

8. The method of claim 7, further comprising filling an insulating layer in each of the second recesses after the etching back step is performed.

9. The method of claim 1, wherein the first patterned material layer and the second patterned material layer comprise the same material.

10. The method of claim 9, wherein the first patterned material layer and the second patterned material layer comprise organic dielectric (ODL) layers.

11. The method of claim 1, further comprising forming a multi-layers structure between the first oxide layer and the substrate.

12. The method of claim 11, wherein the multi-layers structure comprises an oxide layer, an amorphous carbon (APF) layer and a nitride layer.

13. The method of claim 1, wherein the thickness of the first patterned material layer is between 1500 and 2500 angstroms.

14. The method of claim 1, wherein the substrate comprises a logic region and a cell region, and the second recess is only located in the cell region.

* * * * *